(12) United States Patent
Hamano et al.

(10) Patent No.: US 12,412,877 B2
(45) Date of Patent: Sep. 9, 2025

(54) CIRCUIT ASSEMBLY AND ELECTRICAL JUNCTION BOX

(71) Applicant: Sumitomo Wiring Systems, Ltd., Yokkaichi (JP)

(72) Inventors: Shinya Hamano, Yokkaichi (JP); Yoshikazu Sasaki, Yokkaichi (JP); Jun Ikeda, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 327 days.

(21) Appl. No.: 17/934,522

(22) Filed: Sep. 22, 2022

(65) Prior Publication Data
US 2023/0103105 A1 Mar. 30, 2023

(30) Foreign Application Priority Data

Sep. 24, 2021 (JP) .................... 2021-155762

(51) Int. Cl.
| | |
|---|---|
| H01L 25/16 | (2023.01) |
| H01L 21/48 | (2006.01) |
| H01L 23/13 | (2006.01) |
| H01L 23/498 | (2006.01) |
| H01L 25/065 | (2023.01) |

(52) U.S. Cl.
CPC ........ H01L 25/162 (2013.01); H01L 21/4846 (2013.01); H01L 23/13 (2013.01); H01L 23/49838 (2013.01); H01L 25/0655 (2013.01)

(58) Field of Classification Search
CPC .................................................. H01L 25/162
USPC ......................................................... 174/520
See application file for complete search history.

(56) References Cited

U.S. PATENT DOCUMENTS

| | | | |
|---|---|---|---|
| 6,522,528 B2* | 2/2003 | Yamane | .............. B60R 16/0238 |
| | | | 361/601 |
| 2002/0141143 A1 | 10/2002 | Yamane | |
| 2019/0164878 A1 | 5/2019 | Hattori et al. | |

FOREIGN PATENT DOCUMENTS

| | | |
|---|---|---|
| DE | 112016006928 T5 | 2/2019 |
| JP | H10256291 A | 9/1998 |

OTHER PUBLICATIONS

German Patent and Trademark Office, Office Action dated Jul. 16, 2025, Application No. 10 2022 122 696.4.

* cited by examiner

*Primary Examiner* — Timothy J Thompson
*Assistant Examiner* — Sidi M Maiga
(74) *Attorney, Agent, or Firm* — Honigman LLP

(57) ABSTRACT

A circuit assembly includes a plurality of electronic components; a plurality of control terminals electrically connected to the plurality of electronic components; and a holding member having insulating properties and holds the plurality of control terminals, wherein the control terminals serve as insert articles that form one piece with the holding member that is made of a resin, the control terminals each include: in a partial portion of the control terminal, an exposed face that is exposed from the holding member; a contact face that is located opposite to the exposed face and is in contact with the holding member; a first side face located between the exposed face and the contact face; and a second side face located between the exposed face and the contact face, and a first space formed lateral to the first side face, and a second space formed lateral to the second side face.

14 Claims, 9 Drawing Sheets

CIRCUIT ASSEMBLY AND ELECTRICAL JUNCTION BOX

CROSS-REFERENCE TO RELATED APPLICATIONS

This application claims priority of Japanese Patent Application No. JP 2021-155762 filed on Sep. 24, 2021, the contents of which are incorporated herein.

TECHNICAL FIELD

The present disclosure relates to a circuit assembly and an electrical junction box.

BACKGROUND

JP 2019-96769A discloses a circuit assembly that includes a control board, a plurality of switching elements that operate based on signals from the control board, and busbars constituting a power circuit. The switching elements are connected to the busbars using solder.

JP 2019-96769A is an example of related art.

The circuit assembly further includes, in addition to the busbar, a plurality of control terminals as constituent components of the power circuit. The control terminals are electrically connected to electronic components such as switching elements, and signals from the control board are transmitted to the electronic components via the control terminals.

The circuit assembly further includes a holding member that has insulating properties and holds the control terminals. The holding member is made of a thermoplastic resin, and is molded by injection molding. The molding of the holding member may be performed in a manner such that the control terminals are placed as insert articles in a die for injection molding. FIG. 9 is a cross-sectional view showing part of the die 90 for injection molding, and a control terminal 91.

By bringing part of the control terminal 91 into surface-contact with the die 90, the control terminal 91 can be positioned with respect to the die 90. However, during the injection molding, due to an injection pressure of a molten resin 99, the resin 99 may partially flow into the space between the die 90 and the control terminal 91, causing a risk in which as shown in FIG. 9, the control terminal 91 is inclined or deformed inside the die 90. If such a situation occurs, the control terminal 91 may come into contact with another conductor 92 such as a busbar that forms one piece with the holding member 95, and a short-circuit may occur.

Therefore, it is an object of the present disclosure to provide a circuit assembly that can suppress a movement or deformation of a control terminal when a resin holding member is molded.

SUMMARY

According to an aspect of the present disclosure, a circuit assembly includes: a plurality of electronic components; a plurality of control terminals electrically connected respectively to the plurality of electronic components; and a holding member that has insulating properties and holds the plurality of control terminals, wherein the control terminals serve as insert articles that form one piece with the holding member that is made of a resin, each of the control terminals includes: in a partial portion of the control terminal, an exposed face exposed from the holding member; a contact face that is located opposite to the exposed face and is in contact with the holding member; a first side face located between the exposed face and the contact face; and a second side face located between the exposed face and the contact face, and a first space is formed lateral to the first side face, and a second space is formed lateral to the second side face.

According to an aspect of the present disclosure, an electrical junction box includes the above-described circuit assembly, and a cover that covers the circuit assembly.

Advantageous Effects

According to the present disclosure, it is possible to suppress a movement or deformation of a control terminal due to an injection pressure of a molten resin when a resin holding member is molded.

DETAILED DESCRIPTION OF PREFERRED EMBODIMENTS

Figure 1:
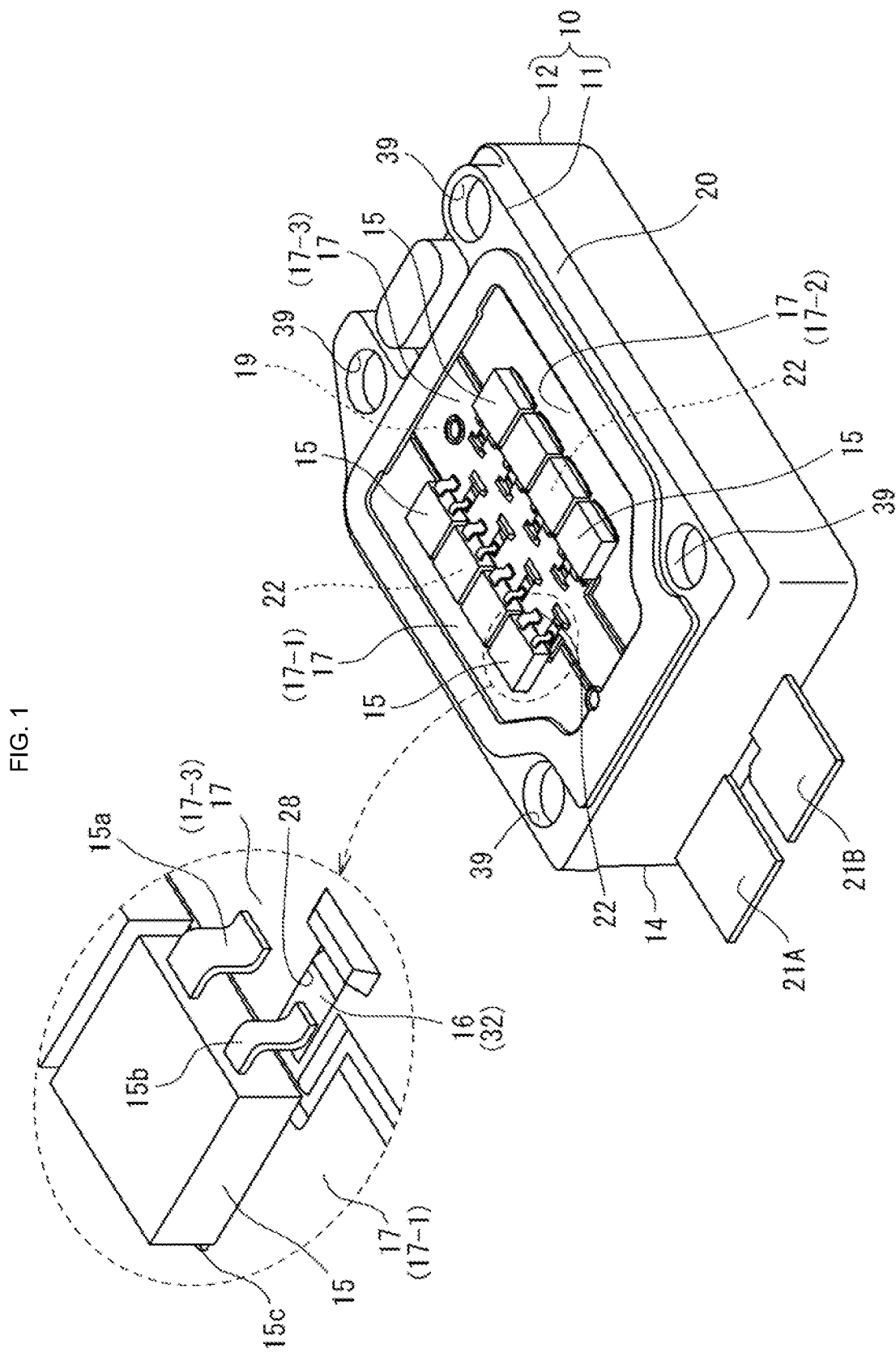
FIG. 1 is a perspective view illustrating an electrical junction box including a circuit assembly according to an embodiment.

Hereinafter, overviews of an embodiment of the present disclosure will be listed and described.

First Aspect

According to the present embodiment, a circuit assembly includes: a plurality of electronic components; a plurality of control terminals electrically connected respectively to the plurality of electronic components; and a holding member that has insulating properties and holds the plurality of control terminals, wherein the control terminals serve as insert articles that form one piece with the holding member that is made of a resin, each of the control terminals includes: in a partial portion of the control terminal, an exposed face exposed from the holding member; a contact face that is located opposite to the exposed face and is in contact with the holding member; a first side face located between the exposed face and the contact face; and a second side face located between the exposed face and the contact face, and a first space is formed lateral to the first side face, and a second space is formed lateral to the second side face.

In the circuit assembly according to the present embodiment, the control terminals serve as insert articles that form one piece with the holding member that is made of a resin, and when the holding member is molded, a molten resin fills up the vicinity of the control terminals. The contact face of part of a control terminal comes into contact with the holding member, and the part of the control terminal forms one piece with the holding member. The exposed face of part of the control terminal is formed by coming into contact with a molding die.

When the die is provided with projections on both sides of part of the control terminal, after the molding, the first space is formed lateral to the first side face, and the second space is formed lateral to the second side face. As a result of the die including projections on both sides of part of the control terminal in this way, a molten resin is unlikely to enter the space between the portion to serve as the exposed face and the die. Therefore, during molding of the holding member, it is possible to suppress such a situation that due to the injection pressure of a molten resin, the control terminals move or deform.

Second Aspect

Preferably, the holding member includes: a thick portion that is in contact with the contact face; a first thin-film portion that is made of a resin and covers the first side face; and a second thin-film portion that is made of a resin and covers the second side face, a side face of the first thin-film portion is exposed in the first space, and a side face of the second thin-film portion is exposed in the second space. With this configuration, not only the contact face of the control terminal, but also the first side face and the second side face thereof are joined to the resin holding member, and thus the control terminal is unlikely to be removed from the holding member.

For the molding of the holding member, the die is provided with the pair of projections, and part of the control terminal is interposed between the pair of projections. Manufacturing errors are conceivable in a first size between the pair of projections, and a second size between the first side face and the second side face of the control terminal. To place part of the control terminal between the pair of projections, the first size is preferably set to be slightly greater than the second size. As a result, small gaps are formed between the projections and the control terminal, and there is a possibility of a molten resin flowing into the small gaps. However, the small gaps e are thin, and the molten resin is unlikely to enter the small gaps. Therefore, the molten resin is unlikely to enter the space between the die and the control terminal via the small gaps. Note that when the molten resin that could enter the small gaps is cured, the cured portion will serve as the first thin-film portion and the second thin-film portion.

Third Aspect

Preferably, the circuit assembly further includes a control board configured to output signals to the electronic components via the control terminals, wherein each of the control terminal includes: a first terminal body portion connected to the control board; a pad portion that is electrically connected to the first terminal body portion, is provided along the holding member, and includes the exposed face and the contact face, the pad portion serving as the partial portion; and a second terminal body portion electrically connected to the pad portion and the corresponding electronic component.

With this configuration, by bringing a probe of a tester for electrical testing into contact with the pad portions before the control board is connected to the first terminal body portions of the control terminals, electrical testing is conducted for each of the plurality of electronic components. Since the face (contact face) of the pad portion opposite to the exposed face is in contact with the holding member, the pad portion is prevented from deforming even if the probe of the tester is brought into contact with the exposed face.

Fourth Aspect

Preferably, the pad portion extends from a base portion of the first terminal body portion, and the holding member includes a first embedding portion in which a boundary region between the first terminal body portion and the pad portion of the control terminal is embedded. In this case, the embedding portion can prevent the first terminal body portion from floating upward from the holding member.

Fifth Aspect

Preferably, the pad portion extends from a base portion of the second terminal body portion, the holding member includes a second embedding portion in which a boundary region between the pad portion and the second terminal body portion is embedded, and the second embedding portion includes a resin face that is coplanar with the exposed face of the pad portion. In this case, since the exposed face of the pad portion and the resin face of the second embedding portion are coplanar, the molding using the die is easy in the portion of the holding member that covers the portion between the pad portion and the second terminal body portion. Also, the configuration of the die is simplified.

Sixth Aspect

Preferably, the second terminal body portion includes: a terminal face that is exposed from the holding member and is connected to the corresponding electronic component; and a second exposed face that is located opposite to the terminal face and is exposed from the holding member.

When the holding member is made of a resin and is molded by injection molding using the die, it is sufficient to partially bring a metal member to serve as the second terminal body portion into contact with the die, and position the metal member. When the die is brought into contact with that portion from both sides so as to sandwich that portion, the terminal face and the second exposed face are formed. By bringing the die into contact with the second terminal body portion from both sides, the positioning accuracy of the second terminal body portion, particularly, with respect to the terminal face is improved. As a result, a connection failure between the terminal face and the electronic component is suppressed.

Seventh Aspect

An electrical junction box according to the present embodiment includes: the circuit assembly according to any one of the first to sixth aspects; and a cover that covers the circuit assembly.

According to the electrical junction box of the present embodiment, during molding of the resin holding member, a movement or deformation of the control terminals due to an injection pressure of a molten resin can be suppressed.

The following will describe details of the embodiment of the present disclosure with reference to the drawings. Note that at least some features of the embodiment described below may be combined with each other as appropriate.

Regarding Electrical Junction Box 10

FIG. 1 is a perspective view illustrating an electrical junction box 10 including a circuit assembly 11 according to the present embodiment. The electrical junction box 10 can be installed in various devices, and in the present embodiment, the electrical junction box 10 is installed in an automobile. More specifically, the electrical junction box 10 is provided on a not-shown wiring route connecting a first on-board device and a second on-board device. The electrical junction box 10 includes the circuit assembly 11, and a cover 12 that covers the circuit assembly 11. The cover 12 is made of metal (aluminium or an aluminium alloy), and has a heat dissipation function of dissipating heat generated in the circuit assembly 11. The electrical junction box 10 may further include another unit (not shown) attached to the circuit assembly 11 on a side opposite to the cover 12.

Regarding Circuit Assembly 11

Figure 2:
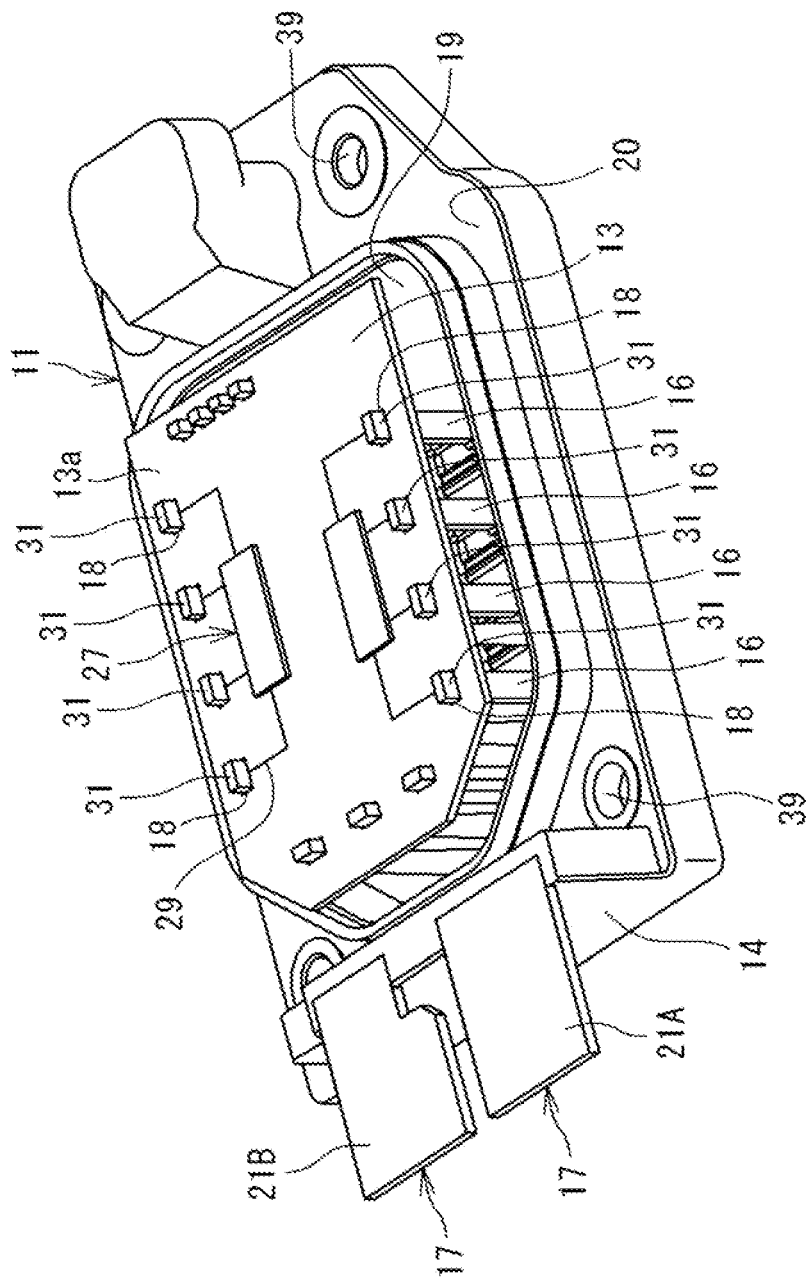
FIG. 2 is a perspective view of the circuit assembly when viewed from the side opposite to that in FIG. 1.
Figure 3:
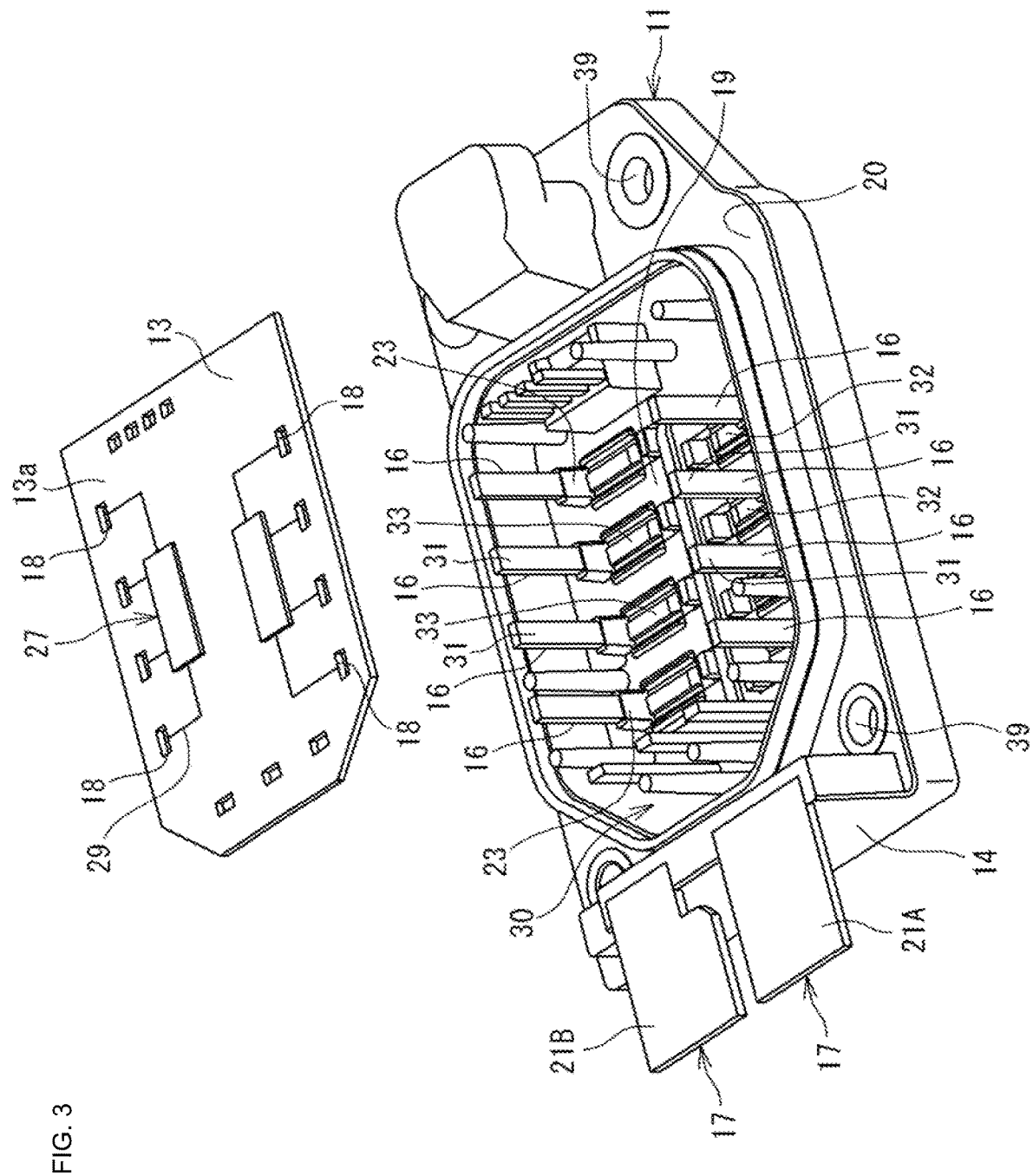
FIG. 3 is an exploded view of the circuit assembly from which a control board is detached.

FIG. 2 is a perspective view of the circuit assembly 11 when viewed from the side opposite to that in FIG. 1. FIG. 2 shows a state in which the cover 12 is detached. In FIGS. 1 and 2, the circuit assembly 11 includes a plurality of electronic components 15, a plurality of control terminals 16, one holding member 14, and one control board 13. FIG. 3 is an exploded view of the circuit assembly 11 from which a control board 13 is detached. The circuit assembly 11 further includes a plurality of conductive plates 17. The plurality of conductive plates 17 and the plurality of control terminals 16 constitute a power circuit of the circuit assembly 11.

In the present embodiment, the circuit assembly 11 includes three conductive plates 17 (see FIG. 1), and eight control terminals 16 (see FIG. 3). The number of the control terminals 16 and the number of the electronic components 15 are the same, and one control terminal 16 is connected to one electronic component 15 in a one-to-one relationship. Note that suitable numbers of conductive plates 17, control terminals 16, electronic components 15, and control boards 13 are provided, and the numbers may be changed as needed.

The electronic components 15 are, for example, semiconductor relays such as field effect transistors (FETs). The following description relates to a case where the electronic components 15 are field-effect transistors, which will be referred to as "FETs". The FETs 15 include a plurality of terminals. As shown in the enlarged view of FIG. 1, the FET 15 includes, as a plurality of terminals, a source terminal (first terminal) 15a, a gate terminal (second terminal) 15b, and a drain terminal (third terminal) 15c. The terminals are mechanically and electrically connected to the conductive plates 17 or the control terminals 16 using solder or the like.

Each conductive plate 17 is manufactured by pressing a metal plate into a predetermined shape. The conductive plate 17 is a piece of metal plate, and is referred to also as a busbar. The conductive plate 17 is preferably a member made of copper such as pure copper or a copper alloy, for example. The entirety of the conductive plate 17 is a conductor, and the conductive plate 17 does not have any wiring pattern as formed on a typical printed circuit board. As shown in FIG. 1, the circuit assembly 11 includes a first conductive plate 17-1, a second conductive plate 17-2, and a third conductive plate 17-3.

Figure 4:
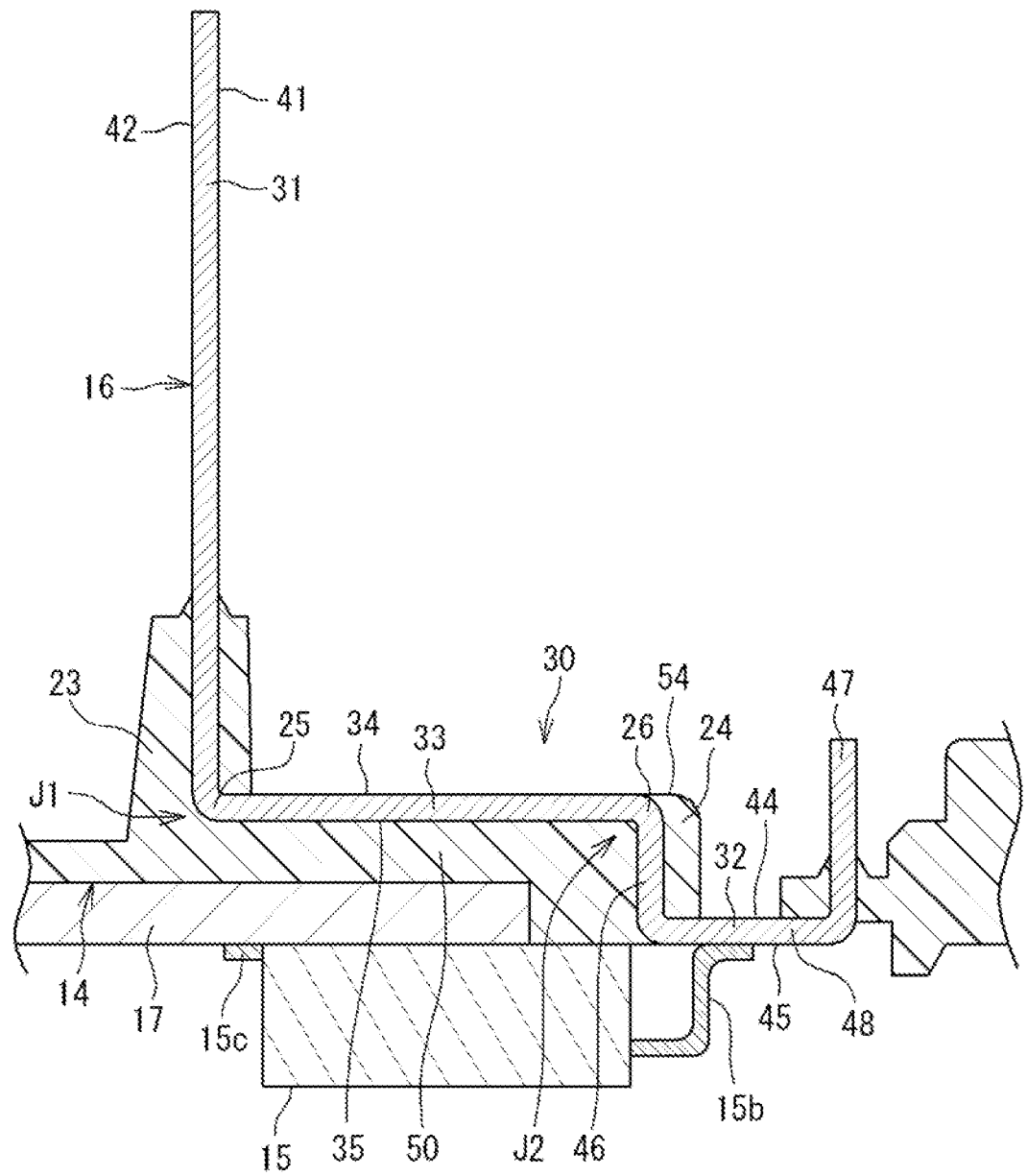
FIG. 4 is a cross-sectional view illustrating a control terminals and part of a holding member.

The control terminals 16 are manufactured by pressing metal wire materials into a predetermined shape. The control terminals 16 are terminals made of metal. The control terminals 16 are preferably members made of copper such as pure copper or a copper alloy, for example. FIG. 4 is a cross-sectional view illustrating a control terminal 16 and part of the holding member 14. The control terminal 16 has a bent shape, and includes a first terminal body portion 31, a pad portion 33, and a second terminal body portion 32. The components of the control terminal 16 will be described in detail later.

In FIG. 2, the control board 13 is an insulated substrate having a substantially rectangular shape, and includes, on a first surface 13a thereof, at least one control circuit unit 27. The control circuit unit 27 has a function of outputting signals to the FETs 15 via the control terminals 16. The FETs 15 operate based on the signals. The control circuit unit 27 has an integrated circuit including switching elements, serving as second electronic components for operating the FETs 15, diodes, and the like. A wiring pattern 29 for electrically connecting the second electronic components to the control terminals 16 is included in the control circuit unit 27.

The control board 13 has through holes 18 through which the control terminals 16 are partially passed (see FIG. 3). By filling the through holes 18 with an electrically-conducting material, the control circuit unit 27 is electrically and mechanically connected to part of the first terminal body portions 31 of the control terminals 16. Before the control board 13 is connected to the control terminals 16 (see FIG. 3), the plurality of control terminals 16 are not electrically connected to each other (in a non-conducting state).

The holding member 14 is made of a thermoplastic resin, and is molded by injection molding. In the present embodiment, as will be described later, the holding member 14 is manufactured by insert molding that is performed with the control terminals 16 and the conductive plates 17 placed in a die 60 for injection molding (see FIG. 7). Therefore, the control terminals 16 and the conductive plates 17 are partially embedded in the holding member 14, and the control terminals 16, the conductive plates 17, and the holding member 14 are formed as one piece. The control terminals 16 and the conductive plates 17 are insert articles that forms one piece with the resin holding member 14.

The holding member 14 is made of, for example, polyphenylene sulfide (PPS), polybutylene terephthalate (PBT), nylon, polypropylene (PP), polyethylene (PE), or the like, and has insulating properties. The holding member 14 holds the eight control terminals 16 and the three conductive plates 17, and functions as a case of the circuit assembly 11. As shown in FIG. 3, the holding member 14 has a housing space 30 that is open toward the control board 13. The first terminal body portions 31 and the pad portions 33 of the control terminals 16 are provided in the housing space 30. The control board 13 is attached to the first terminal body portions 31 so as to close the housing space 30.

The holding member 14 includes a plate-shaped base portion 19 provided in the center of the holding member 14, and a frame portion 20 provided surrounding of the base portion 19. As shown in FIG. 1, main portions 22 of the conductive plates 17 on which the FETs 15 are mounted are provided on the base portion 19. The main portions 22 of the three conductive plates 17 are arranged side by side in a flat manner on the base portion 19 without overlapping each other. Each of the three conductive plates 17 are provided at separate positions, and are not in contact with each other. The three conductive plates 17 and the control terminals 16 are provided at separate positions, and are not in contact with each other.

In the present embodiment (see FIG. 1), the source terminals 15a of the FETs 15 are connected to the third conductive plate 17-3 located in the center. The drain terminals 15c of the FETs 15 is connected to the first conductive plate 17-1 or the second conductive plate 17-2. As shown in the enlarged view of FIG. 1, the third conductive plate 17-3 located in the center has a hole 28 penetrating therethrough, and part of the second terminal body portion 32 of the control terminal 16 is exposed from the hole 28. The gate terminal 15b of the FET 15 is connected to the part of the second terminal body portion 32 exposed from the hole 28. With this, the gate terminal 15b of the FET 15 and the control terminal 16 are electrically connected to each other.

The frame portion 20 has fixation holes 39 used to fix the cover 12 thereto. An end portion 21A of the first conductive plate 17-1 and an end portion 21B of the second conductive plate 17-2 protrude outward from the frame portion 20. Not-shown cables or the like is connected to the end portions 21A and 21B.

Control Terminal 16

Figure 5:
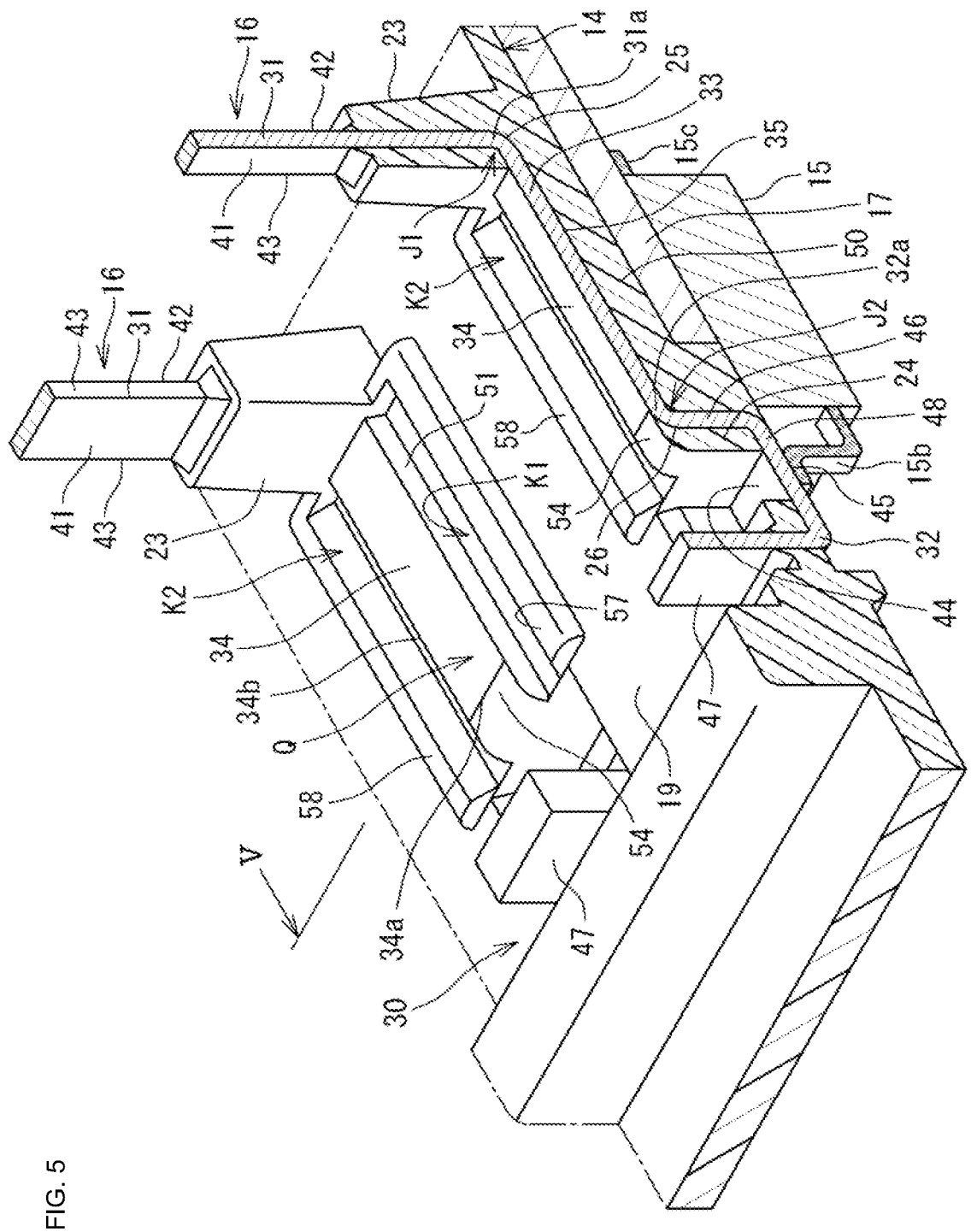
FIG. 5 is a perspective view illustrating control terminals and part of the holding member.

FIG. 5 is a perspective view illustrating control terminals 16 and part of the holding member 14. The control terminals 16 have a bent shape as described above, and each include the first terminal body portion 31, the pad portion 33, and the second terminal body portion 32. In the present embodiment, the first terminal body portion 31, the pad portion 33, and the second terminal body portion 32 are formed by bending and molding a single metal member. That is to say, the first terminal body portion 31 is constituted by a part of an elongated plate-shaped metal member, the pad portion 33 is constituted by another part of the metal member, and the second terminal body portion 32 is constituted by yet another part of the metal member that is different from the parts constituting the first terminal body portion 31 and the pad portion 33.

Figure 6:
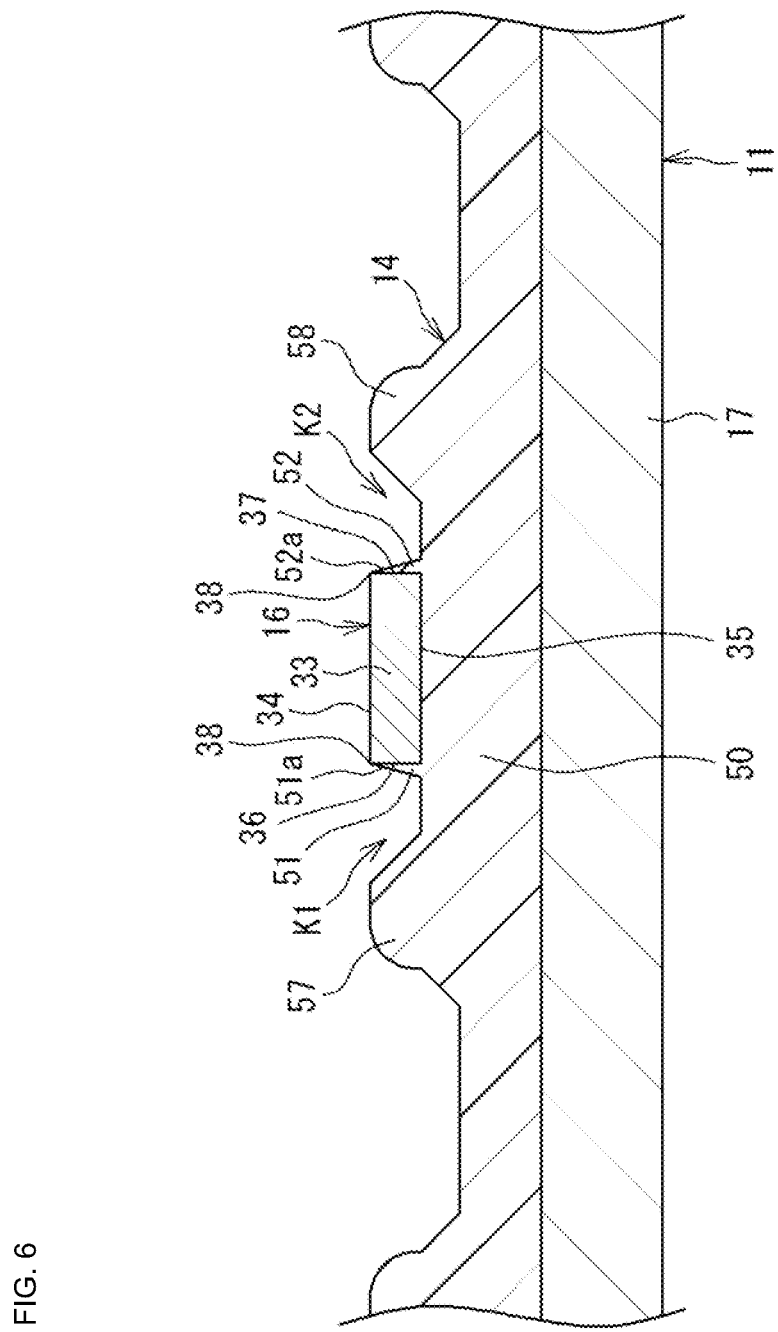
FIG. 6 is a cross-sectional view taken along a line V in FIG. 5.

Each of the first terminal body portion 31, the pad portion 33, and the second terminal body portion 32 are rectangular in a traverse cross section (see FIG. 6). FIG. 6 is a cross-sectional view taken along a line V in FIG. 5. As shown in FIG. 5, the first terminal body portion 31 is linear. The control terminal 16 is bent at a right angle between the first terminal body portion 31 and the pad portion 33. The pad portion 33 extends from a base portion 31a of the first terminal body portion 31, and is linear. The control terminal 16 is bent at a right angle between the second terminal body portion 32 and the pad portion 33. The pad portion 33 extends from a base portion 32a of the second terminal body portion 32, and is linear. The second terminal body portion 32 is U-shaped.

First Terminal Body Portion 31

The first terminal body portions 31 are connected to the control board 13 (see FIGS. 2 and 3). A leading ends of the first terminal body portions 31 are inserted into the through holes 18 formed in the control board 13, and are electrically connected to the wiring pattern 29 provided on the control board 13. As described above, the control circuit units 27 included in the control board 13 output signals to the FETs 15 via the control terminals 16. The signals are output from the control board 13 to the first terminal body portions 31. The signals are given to the gate terminals 15b of the FETs 15 from the first terminal body portions 31 via the pad portions 33 and the second terminal body portions 32 (see FIG. 5).

The first terminal body portions 31 have the shape of an elongated plate. Each first terminal body portion 31 protrudes from a corresponding first embedding portion 23, which is a part of the holding member 14. A portion of the first terminal body portion 31 that protrudes from the first embedding portion 23 is entirely exposed. That is to say, as shown in FIG. 5, the first terminal body portion 31 includes a first face 41 that is exposed from the holding member 14 on one side in the thickness direction of the first terminal body portion 31, and a second face 42 that is located opposite to the first face 41 and is exposed from the holding member 14. Furthermore, two side faces 43 of the first terminal body portion 31 that are located between the first face 41 and the second face 42 are also exposed. The first terminal body portion 31 extends from the first embedding portion 23 in a cantilever fashion before the control board 13 is connected to the first terminal body portion 31.

Pad Portion 33

The pad portion 33 extends from the base portion 31a of the first terminal body portion 31, and the pad portion 33 serves as one piece with and is electrically connected to the first terminal body portion 31. The pad portion 33 has the shape of an elongated plate. As shown in FIG. 5, the pad portion 33 is provided along the holding member 14, and is exposed from part of the holding member 14. The pad portion 33 is provided along a thick portion 50 included in the holding member 14.

As shown in FIGS. 4 and 5, the pad portion 33 includes a first exposed face 34 exposed from the holding member 14, and a contact face 35 located opposite to the first exposed face 34. The first exposed face 34 has an elongated shape. Specifically, for example, the first exposed face 34 has an elongated rectangular shape, and includes a first side 34a, and a second side 34b that is more than twice as long as the first side 34a. The contact face 35 is entirely in contact with the holding member 14, and is a non-exposed face that is not exposed from the holding member 14. As described above, the holding member 14 is manufactured by insert molding that is performed with the control terminals 16 placed in the die 60 for injection molding (see FIG. 7). Therefore, the pad portion 33 is joined to part of the holding member 14 on the contact face 35.

As shown in FIG. 6, the pad portion 33 includes, in addition to the first exposed face 34 and the contact face 35, a first side face 36 and a second side face 37. The first side face 36 is a face located between the first exposed face 34 and the contact face 35. The second side face 37 is a face that is located opposite to the first side face 36 and is located between the first exposed face 34 and the contact face 35.

In the present embodiment, the first side face 36 is covered by a first thin-film portion 51, which is made of a resin, and the second side face 37 is covered by a second thin-film portion 52, which is made of a resin. The first thin-film portion 51 and the second thin-film portion 52 constitute part of the holding member 14. The first thin-film portion 51 and the second thin-film portion 52 are both film-shaped resin portions, and are thinner than the thick portion 50 to which the contact face 35 is adjoined. A first space K1 is formed lateral to the first side face 36 covered by the first thin-film portion 51. A second space K2 is formed lateral to the second side face 37 covered by the second thin-film portion 52.

A side face 51a of the first thin-film portion 51 is exposed in the first space K1. A side face 52a of the second thin-film portion 52 is exposed in the second space K2. The holding member 14 includes a first bulge portion 57 bulging from the thick portion 50. The first bulge portion 57 and the pad portion 33 are provided at separate positions. The space formed between the first bulge portion 57 and the pad portion 33 (a first thin portion 51) serves as the first space K1. The holding member 14 includes a second bulge portion 58 bulging from the thick portion 50. The second bulge portion 58 and the pad portion 33 are provided at separate positions. The space formed between the second bulge portion 58 and the pad portion 33 (a second thin portion 52) serves as the second space K2.

Second Terminal Body Portion 32

As shown in FIG. 5, the second terminal body portion 32 is provided so as to be continuous with the pad portion 33. The second terminal body portion 32 has a shape (U-shape) such that an elongated plate is bent. The base portion 32a of the second terminal body portion 32 is continuous with the pad portion 33, and the second terminal body portion 32 is electrically connected to the pad portion 33. The second terminal body portion 32 includes a first area 46 continuous with the pad portion 33, a second area 47 provided at a distance to and in parallel to the first area 46, and an intermediate area 48 that connects the first area 46 and the second area 47. The second area 47 is exposed from the holding member 14, and the intermediate area 48 has a face exposed from the holding member 14.

The gate terminal 15b of the FET 15 is connected to the intermediate area 48 using solder or the like. With this, the second terminal body portion 32 is mechanically and electrically connected to the FET 15. The second terminal body portion 32 includes, on the intermediate area 48 thereof, a terminal face 45 exposed from the holding member 14, and a second exposed face 44 that is located opposite to the terminal face 45 and is exposed from the holding member 14. The FET 15 (gate terminal 15b) is connected to the terminal face 45.

Holding Member 14

Figure 7:
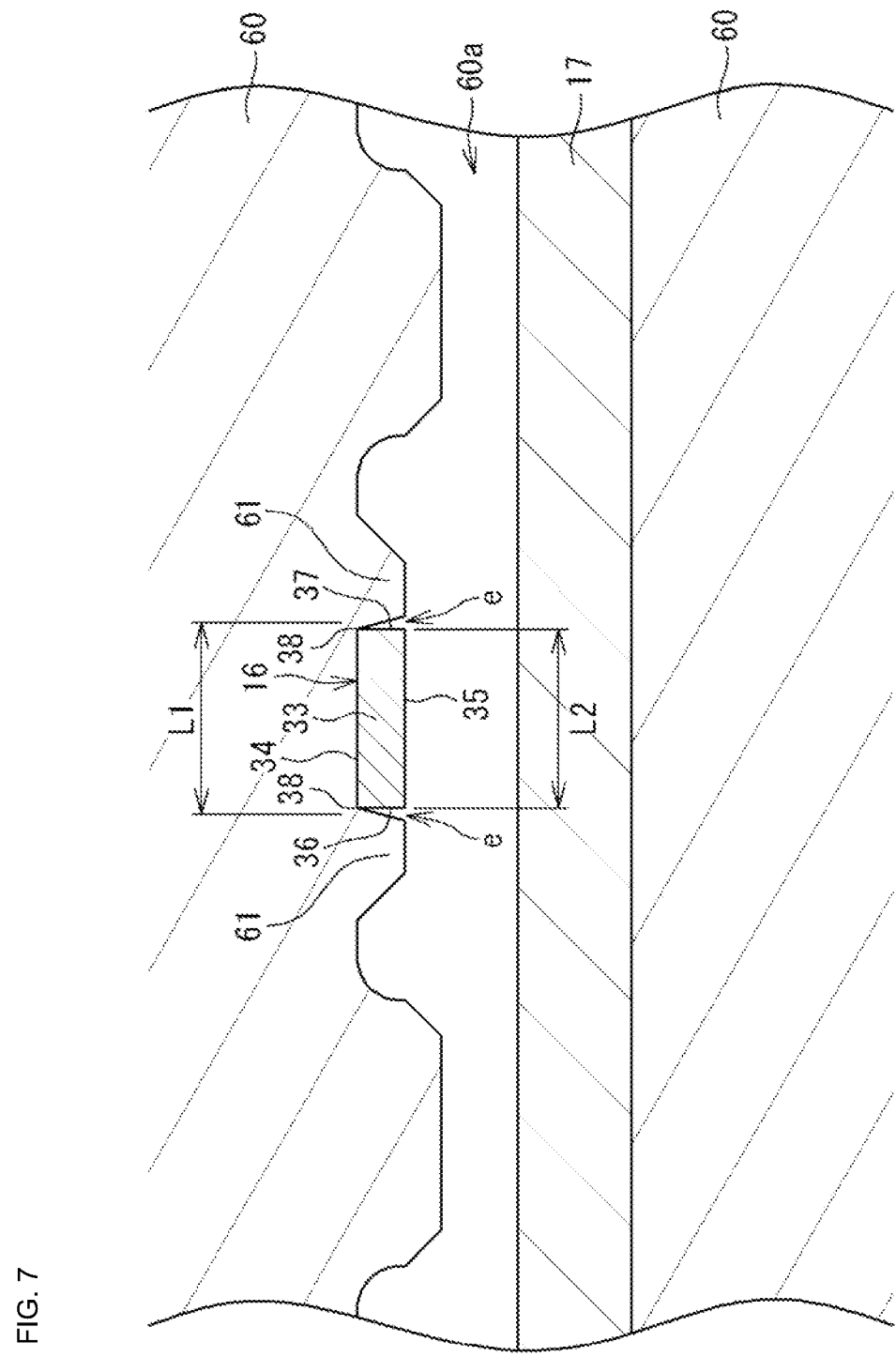
FIG. 7 is a cross-sectional view illustrating part of a die for molding the holding member that is made of a resin.

FIG. 7 is a cross-sectional view illustrating part of the die 60 for molding the resin holding member 14. With the portion of the die 60 that is shown in FIG. 7, the cross-sectional structure of the circuit assembly 11 shown in FIG. 6 is obtained. In the circuit assembly 11 of the present embodiment, the control terminals 16 and the conductive plates 17 function as insert articles that forms one piece with the resin holding member 14. When molding the holding member 14, a cavity 60a formed inside the die 60 is filled with a molten resin. The molten resin also fills up the vicinity of the control terminals 16. With this molding, the contact face 35 of the pad portion 33 included in the control terminal 16 is in contact with the holding member 14 (see FIG. 6), and the pad portion 33 is formed as one piece with the holding member 14. In the cavity 60a, the molten resin also fills up the vicinity of the conductive plates 17. With this, the conductive plates 17 are in contact with the holding member 14 (see FIG. 6), and is formed as one piece with the holding member 14.

As shown in FIG. 7, the exposed face 34 of the pad portion 33 is in contact with the die 60 during the molding, and is completed when separating the metal member from the die 60 at the time of removal of the die 60. The die 60 is provided with projections 61 on both sides of the pad portion 33. With these projections 61, after the molding (see FIG. 6), the first space K1 is formed lateral to the first side face 36 of the pad portion 33, and the second space K2 is formed lateral to the second side face 37. The projections 61 are portions constituting the die 60.

The cross-sectional shape of the first space K1 and the second space K2 matches the cross-sectional shape of the projections 61. Accordingly, since the die 60 is provided with the pad portions 61 on both sides of the pad portion 33, a molten resin is unlikely to enter the space between the portion to serve as the exposed face 34 and the die 60. That is to say, the molten resin flows through and fills up the cavity 60a, and at that time, the projections 61 function as barriers for hiding the pad portion 33, making the flow of the resin unlikely to affect the pad portion 33.

Therefore, during molding of the holding member 14, it is possible to suppress such a situation that due to the injection pressure of a molten resin, the control terminals 16 including the pad portion 33 move in the cavity 60a or deform. As a result, it is possible to prevent the control terminals 16 (pad portion 33) and the conductive plates 17 from coming into contact with each other (shorting).

As shown in FIG. 6, after molding, the holding member 14 includes a resin thick portion 50 that is in contact with the contact faces 35 of the pad portions 33, a resin first thin-film portion 51 that covers the first side faces 36, and a resin second thin-film portion 52 that covers the second side faces 37. The first thin-film portion 51 and the second thin-film portion 52 are sufficiently thinner than the thick portion 50. The side face 51a of the first thin-film portion 51 is exposed in the first space K1. The side face 52a of the second thin-film portion 52 is exposed in the second space K2. The pad portion 33 has a configuration in which in addition to the contact face 35, the first side face 36 and the second side face 37 are joined to the resin holding member 14. As a result, the control terminals 16 including the pad portion 33 are unlikely to be removed from the holding member 14.

As described above (see FIG. 7), for molding the holding member 14, the die 60 is provided with the pair of projections 61. A portion (pad portion 33) of the control terminal 16 is interposed between these projections 61. A first size L1 between the pair of projections 61, and a second size L2 between the first side face 36 and the second side face 37 of the control terminal 16 may have a manufacturing error. To interpose the pad portion 33 between the pair of projections 61, the first size L1 is preferably set to be slightly greater than the second size L2. As a result, small gaps e are formed between the projections 61 and the pad portion 33. A molten resin may flow into the small gaps e.

However, the small gaps e are thin, and the molten resin is unlikely to enter the small gaps e. Therefore, the molten resin is unlikely to enter the space between the die 60 and the first exposed face 34 of the pad portion 33 via the small gaps e. Note that when the molten resin that could enter the small gaps e is cured, the cured portion will serve as the first thin-film portion 51 and the second thin-film portion 52.

The gap size of the small gaps e is preferably set to a value such that a molten resin is unlikely to enter the small gaps e. With this, corners (edges) 38 of the pad portion 33 that are formed between the first exposed face 34 and the first side face 36 (or the second side face 37) are exposed. The corners 38 are preferably not covered by the first thin-film portion 51 or the second thin-film portion 52. The first thin-film portion 51 and the second thin-film portion 52 are lower than the first exposed face 34 using the thick portion 50 as a standard.

As shown in FIGS. 4 and 5, the first bent portion 25 located between the first terminal body portion 31 and the pad portion 33 is embedded in the first embedding portion 23, which is made of a resin. The first embedding portion 23 is part of the holding member 14. That is to say, the holding member 14 includes the first embedding portion 23 in which a first boundary region J1 of the control terminal 16 located between the first terminal body portion 31 and the pad portion 33 is embedded. Part of the pad portion 33 and most part of the first terminal body portion 31 are exposed from the holding member 14, but the first embedding portion 23 can prevent the first terminal body portion 31 from floating upward from the holding member 14.

A second bent portion 26 located between the second terminal body portion 32 and the pad portion 33 is embedded in a second embedding portion 24, which is made of a resin. The second embedding portion 24 is another part of the holding member 14. That is to say, the holding member 14 includes the second embedding portion 24 in which a second boundary region J2 of the control terminal 16 located between the pad portion 33 and the second terminal body portion 32 is embedded. The second embedding portion 24 can prevent the second terminal body portion 32 and the pad portion 33 from floating upward from the holding member 14.

The first space K1 and the second space K2 are formed via the first thin-film portion 51 and the second thin-film portion 52 on both sides of the pad portion 33 (see FIG. 6) in a direction orthogonal to the longitudinal direction of the pad portion 33. That is to say, the holding member 14 is cut off on both sides of the pad portion 33. In contrast, as shown in FIG. 5, the first embedding portion 23 is provided on the first terminal body portion 31 side of the pad portion 33 in the longitudinal direction of the pad portion 33, and resin embedding is made. The second embedding portion 24 is provided on the second terminal body portion 32 side of the pad portion 33 in the longitudinal direction of the pad portion 33, and resin embedding is made.

The second bent portion 26 between the pad portion 33 and the second terminal body portion 32 is embedded in the second embedding portion 24. The second embedding portion 24 includes a resin face 54 that is coplanar (constitutes the same plane) with the first exposed face 34 of the pad portion 33. Since the first exposed face 34 of the pad portion 33 and the resin face 54 of the second embedding portion 24 are coplanar, the molding using the die 60 (see FIG. 8) is easy in the portion of the holding member 14 that covers the portion (base portion 32a) between the pad portion 33 and the second terminal body portion 32. Also, the configuration of the die 60 is simplified.

Two faces of the intermediate area 48, which is a midway portion of the second terminal body portion 32, are exposed from the holding member 14. That is to say, the second terminal body portion 32 includes, on the intermediate area 48, a terminal face 45 that is exposed from the holding member 14 and is connected to the FET 15, and a second exposed face 44 that is located opposite to the terminal face 45 and is exposed from the holding member 14.

Figure 8:
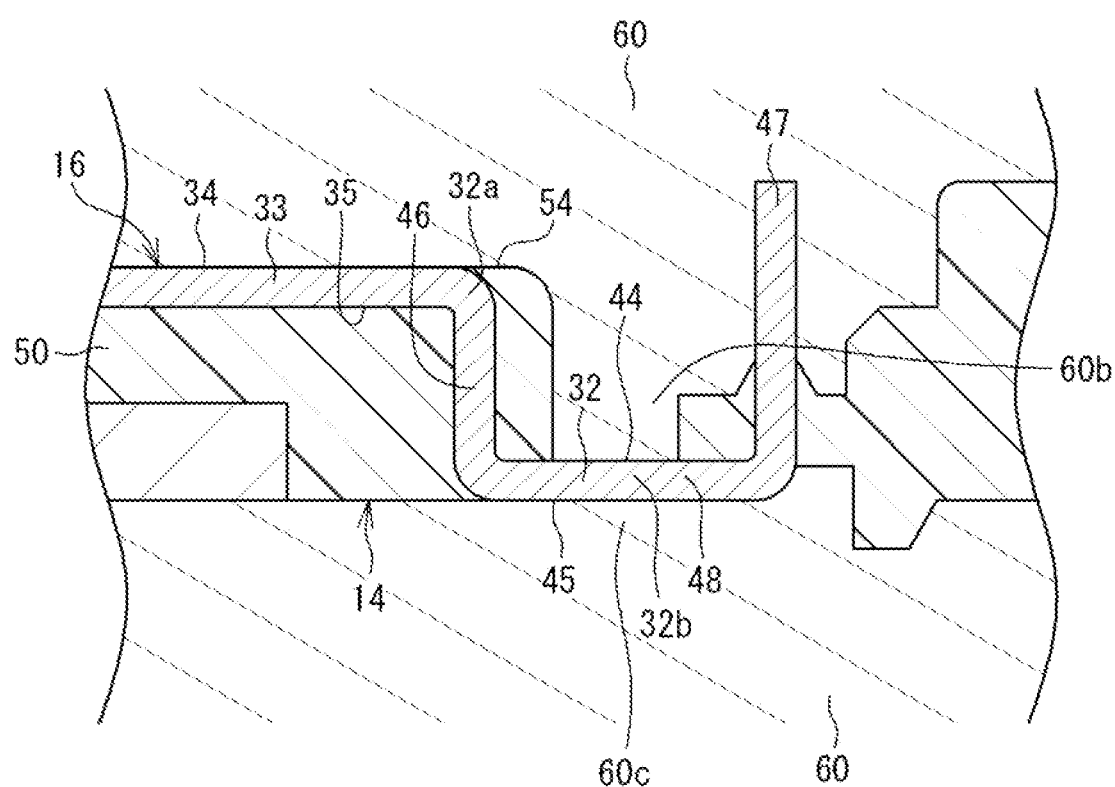
FIG. 8 is a cross-sectional view illustrating an aspect in which the holding member is molded with the control terminal serving as an insert article.

FIG. 8 is a cross-sectional view illustrating an aspect in which the holding member 14 is molded with the control terminal 16 serving as an insert article. FIG. 8 shows the second terminal body portion 32 of the control terminal 16 and the vicinity thereof, together with the die 60. As described above, the holding member 14 is made of a resin, and is molded by injection molding using the die 60. A metal member to serve as the second terminal body portion 32 needs only to be partially brought into contact with the die 60 and be positioned. Here, as shown in FIG. 8, the die 60 is brought into contact with a partial portion 32b of the second terminal body portion 32 so that the partial portion 32b is sandwiched by the die 60 from two sides. The terminal face 45 and the second exposed face 44 are formed on the portions of the second terminal body portion 32 with which the die 60 is in contact.

By bringing a first portion 60b and a second portion 60c of the die 60 into contact with the partial portion 32b of the second terminal body portion 32 from both sides in this way, the positioning accuracy of the second terminal body portion 32, particularly the terminal face 45, is improved. As a result, a connection failure between the terminal face 45 and the FET 15 (gate terminal 15b) is suppressed.

Regarding Electrical Testing of Electronic Components (FET) 15

In the process for manufacturing the circuit assembly 11, electrical testing is conducted to determine whether or not there is any connection failure in the FETs 15. In the case of the circuit assembly 11 of the present embodiment, as shown in FIG. 3, the pad portions 33 included in the control terminals 16 are housed in the housing space 30 of the holding member 14, but the pad portions 33 are exposed to the outside before the control board 13 is connected to the control terminals 16. Therefore, before connecting the control board 13 to the control terminals 16, by bringing a probe of a not-shown tester into contact with the pad portions 33, electrical testing is conducted for each of the plurality of FETs 15.

Figure 9:
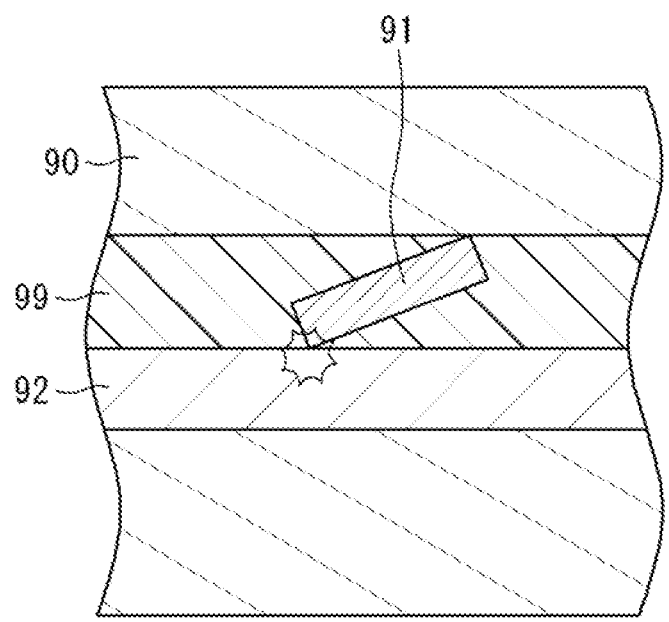
FIG. 9 is a cross-sectional view illustrating part of a die for injection molding, and a control terminal.

For this reason, each of the control terminals 16 includes the pad portion 33, and the second terminal body portion 32 that is electrically connected to the pad portion 33 and the corresponding FET 15. The pad portions 33 are provided along the resin holding member 14, and are exposed from part of the holding member 14. By bringing the probe of the tester into contact with the pad portions 33, the electrical testing can be conducted for the plurality of FETs 15. Therefore, the control board 13 does not need to include any test circuit component 99 (see FIG. 9) as is conventionally provided. As a result of omission of such a test circuit component 99, it is possible to realize a cost reduction of the circuit assembly 11, as well as down-sizing of the control board 13.

In the present embodiment, the first terminal body portion 31 (see FIG. 4) includes the first face 41 exposed from the holding member 14, and the second face 42 that is located opposite to the first face 41 and is exposed from the holding member 14. The first terminal body portion 31 has the shape of a thin and elongated plate, and both the first face 41 and the second face 42 are exposed from the holding member 14. Accordingly, if the probe of the tester is brought into contact with the first face 41 or the second face 42, the first terminal body portion 31 may deform. When the first terminal body portion 31 has deformed, connection to the control board 13 may malfunction.

In contrast, the pad portion 33 includes the first exposed face 34 exposed from the holding member 14, and the contact face 35 that is located opposite to the first exposed face 34 and is in contact with the holding member 14. Since the face (contact face 35) of the pad portion 33 located opposite to the first exposed face 34 is in contact with the holding member 14, even if the probe of the tester is brought into contact with the first exposed face 34, the force caused by the contact is supported by the holding member 14, preventing the pad portion 33 from deforming. It is sufficient to bring the probe of the tester into contact with a target region Q (see FIG. 5) of the first exposed face 34 of the pad portion 33 that is away from the first terminal body portion 31 so that the probe does not interfere with the first terminal body portion 31. The first exposed face 34 of the pad portion 33 has an elongated shape that includes not only the target region Q but also a portion including this target region Q. For example, the first exposed face 34 of the pad portion 33 has the second side 34b that is more than three times as long as the first side 34a.

This is because the holding member 14 is made of a resin, and as described with reference to FIG. 7, the holding member 14 is molded by injection molding using the die 60, and by bringing part of a metal material to serve as the pad portion 33 into contact with the die 60, the contact part serves as the first exposed face 34. That is to say, when the metal member is brought into contact with the die 60, the longer the contact part is, the more reliably the metal member is positioned. Accordingly, by setting the first exposed face 34 of the pad portion 33 as being elongated, the contact area of the metal member with the die 60 increases, and the metal member becomes stable, suppressing occurrence of defective products.

Other Configurations

In the present embodiment, with respect to each control terminal 16, the first terminal body portion 31, the pad portion 33, and the second terminal body portion 32 are formed by bending and molding a single metal member. Therefore, it is not necessary to join the first terminal body portion 31, the pad portion 33, and the second terminal body portion 32 together. Note that one or all of the first terminal body portion 31, the pad portion 33, and the second terminal body portion 32 may be a separate member or separate members, and the control terminals 16 may join these portions together using welding or the like.

As shown in FIG. 4, the pad portion 33 is provided along the holding member 14, and the contact face 35 thereof is entirely in contact with the holding member 14. As another configuration, part of the contact face 35 may be exposed from the holding member 14.

Although the case has been described in which the first exposed face 34 of the pad portion 33 has an elongated and rectangular shape, the first exposed face 34 may also have another shape such as a circular shape or an oval shape.

In the present embodiment (see FIG. 6), the first side face 36 of the pad portion 33 is covered by the first thin-film portion 51, which is made of a resin, and the second side face 37 is covered by the second thin-film portion 52, which is made of a resin. As a modification, either or both of the first thin-film portion 51 and the second thin-film portion 52 may be omitted.

The first space K1 and the second space K2 respectively formed lateral to the first side face 36 and the second side face 37 of the pad portion 33 may have a shape other than the shown shape (cross-sectional shape).

The electronic components 15 (first electronic components 15) may be components other than field-effect transistors, and may be, for example, mechanical relays. Also in this case, when the circuit assembly 11 is completed, the electronic components 15 and the control board 13 are electrically connected to each other, signals are given from the control board 13 to the electronic components 15 via the control terminals 16, and the electronic components 15 operate based thereon. Note that the electrical testing are conducted before connecting the control board 13.

The above-described embodiments are examples in all respects, and are non-limiting. The claimed scope of the present disclosure is indicated by not the above-described embodiments but the claims, and includes all modifications within the scope equivalent to the scope of the claims.

What is claimed is:

1. A circuit assembly comprising:
    a plurality of electronic components;
    a plurality of control terminals electrically connected respectively to the plurality of electronic components; and
    a holding member that has insulating properties and holds the plurality of control terminals,
    wherein the control terminals serve as insert articles that form one piece with the holding member that is made of a resin,
    each of the control terminals includes, in a partial portion of the control terminal:
        an exposed face exposed from the holding member;
        a contact face that is located opposite to the exposed face and is in contact with the holding member;
        a first side face located between the exposed face and the contact face; and
        a second side face located between the exposed face and the contact face, and
    a first space is formed lateral to the first side face, and a second space is formed lateral to the second side face; and
    wherein the holding member includes:
        a thick portion that is in contact with the contact face;
        a first thin-film portion that is made of a resin and covers the first side face; and a second thin-film portion that is made of a resin and covers the second side face, and wherein a side face of the first thin-film portion is exposed in the first space, and a side face of the second thin-film portion is exposed in the second space.

2. The circuit assembly according to claim 1, further comprising:
    a control board configured to output signals to the electronic components via the control terminals,
    wherein each of the control terminal includes:
        a first terminal body portion connected to the control board;
        a pad portion that is electrically connected to the first terminal body portion, is provided along the holding member, and includes the exposed face and the contact face, the pad portion serving as the partial portion; and
        a second terminal body portion electrically connected to the pad portion and the corresponding electronic component.

3. The circuit assembly according to claim 2, wherein the pad portion extends from a base portion of the first terminal body portion, and
    the holding member includes a first embedding portion in which a boundary region between the first terminal body portion and the pad portion of the control terminal is embedded.

4. The circuit assembly according to claim 2, wherein the pad portion extends from a base portion of the second terminal body portion,
    the holding member includes a second embedding portion in which a boundary region between the pad portion and the second terminal body portion is embedded, and
    the second embedding portion includes a resin face that is coplanar with the exposed face of the pad portion.

5. The circuit assembly according to claim 2, wherein the second terminal body portion includes: a terminal face that is exposed from the holding member and is connected to the corresponding electronic component; and a second exposed face that is located opposite to the terminal face and is exposed from the holding member.

6. An electrical junction box comprising:
    the circuit assembly according to claim 1; and
    a cover that covers the circuit assembly.

7. The circuit assembly according to claim 3, wherein the pad portion extends from a base portion of the second terminal body portion,
    the holding member includes a second embedding portion in which a boundary region between the pad portion and the second terminal body portion is embedded, and
    the second embedding portion includes a resin face that is coplanar with the exposed face of the pad portion.

8. The circuit assembly according to claim 3, wherein the second terminal body portion includes: a terminal face that is exposed from the holding member and is connected to the corresponding electronic component; and a second exposed face that is located opposite to the terminal face and is exposed from the holding member.

9. The circuit assembly according to claim 4, wherein the second terminal body portion includes: a terminal face that is exposed from the holding member and is connected to the corresponding electronic component; and a second exposed face that is located opposite to the terminal face and is exposed from the holding member.

10. The electrical junction box according to claim 6, wherein the holding member includes: a thick portion that is in contact with the contact face; a first thin-film portion that is made of a resin and covers the first side face; and a second thin-film portion that is made of a resin and covers the second side face, a side face of the first thin-film portion is exposed in the first space, and a side face of the second thin-film portion is exposed in the second space.

11. The electrical junction box according to claim 6, further comprising:

a control board configured to output signals to the electronic components via the control terminals, wherein each of the control terminal includes:

a first terminal body portion connected to the control board;

a pad portion that is electrically connected to the first terminal body portion, is provided along the holding member, and includes the exposed face and the contact face, the pad portion serving as the partial portion; and a second terminal body portion electrically connected to the pad portion and the corresponding electronic component.

12. The electrical junction box to claim 11, wherein the pad portion extends from a base portion of the first terminal body portion, and the holding member includes a first embedding portion in which a boundary region between the first terminal body portion and the pad portion of the control terminal is embedded.

13. The electrical junction box to claim 11, wherein the pad portion extends from a base portion of the second terminal body portion, the holding member includes a second embedding portion in which a boundary region between the pad portion and the second terminal body portion is embedded, and the second embedding portion includes a resin face that is coplanar with the exposed face of the pad portion.

14. The electrical junction box according to claim 11, wherein the second terminal body portion includes: a terminal face that is exposed from the holding member and is connected to the corresponding electronic component;

and a second exposed face that is located opposite to the terminal face and is exposed from the holding member.

\* \* \* \* \*